United States Patent
Yamashita et al.

(10) Patent No.: US 11,744,065 B2
(45) Date of Patent: Aug. 29, 2023

(54) READ-ONLY MEMORY FOR CHIP SECURITY THAT IS MOSFET PROCESS COMPATIBLE

(71) Applicant: International Business Machines Corporation, Armonk, NY (US)

(72) Inventors: Tenko Yamashita, Schenectady, NY (US); Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 17/481,585

(22) Filed: Sep. 22, 2021

(65) Prior Publication Data

US 2023/0092137 A1   Mar. 23, 2023

(51) Int. Cl.
*H10B 20/20* (2023.01)
*H10B 20/00* (2023.01)

(52) U.S. Cl.
CPC .............. *H10B 20/20* (2023.02); *H10B 20/65* (2023.02)

(58) Field of Classification Search
CPC ................................ H10B 20/20; H10B 20/65
See application file for complete search history.

(56) References Cited

U.S. PATENT DOCUMENTS

| | | | |
|---|---|---|---|
| 6,456,554 B1 | 9/2002 | Gelsomini | |
| 6,525,955 B1 | 2/2003 | Smith et al. | |
| 6,611,040 B2 | 8/2003 | Gelsomini et al. | |
| 6,897,522 B2 | 5/2005 | Harari et al. | |
| 7,420,842 B1 | 9/2008 | Ahrens et al. | |
| 8,402,241 B2 | 3/2013 | Miranda et al. | |
| 10,229,746 B2 | 3/2019 | Chung | |
| 2008/0135946 A1 | 6/2008 | Yan | |
| 2008/0298114 A1* | 12/2008 | Liu | G11C 13/0004 257/E21.536 |
| 2012/0214477 A1* | 8/2012 | Wieslawa | H04W 4/18 455/507 |
| 2012/0314477 A1* | 12/2012 | Siau | G11C 13/0097 365/148 |

FOREIGN PATENT DOCUMENTS

| | | |
|---|---|---|
| TW | 316686 U | 9/1997 |
| TW | 200826293 A | 6/2008 |
| TW | I344195 B | 6/2009 |
| TW | I453898 B | 9/2014 |

* cited by examiner

*Primary Examiner* — Meiya Li
(74) *Attorney, Agent, or Firm* — Cantor Colburn LLP; Jeffrey L. Kelly

(57) ABSTRACT

A semiconductor device is provided. The semiconductor device includes a metal-oxide-semiconductor field-effect-transistor (MOSFET) device electrically attachable to a first data line and a read-only memory (ROM) element. The ROM element is electrically interposable between the MOSFET device and a second data line. The ROM element includes first and second sets of memory cells in high and low resistance states, respectively, to form a secure identifier (ID).

12 Claims, 4 Drawing Sheets

READ-ONLY MEMORY FOR CHIP SECURITY THAT IS MOSFET PROCESS COMPATIBLE

BACKGROUND

The present invention generally relates to fabrication methods and resulting structures for semiconductor devices. More specifically, the present invention relates to low-cost, read-only memory (ROM) for chip security that is compatible with metal-oxide-semiconductor field-effect-transistor (MOSFET) processing.

CMOS, also known as complementary metal-oxide-semiconductor (CMOS), is a type of metal-oxide-semiconductor field-effect transistor (MOSFET) fabrication process that uses complementary and pairs of p-type and n-type MOSFETs for logic functions. CMOS technology is used for constructing integrated circuit (IC) chips, including microprocessors, microcontrollers, memory chips and other digital logic circuits. CMOS technology is also used for analog circuits such as image sensors, data converters, RF circuits and highly integrated transceivers for many types of communication.

SUMMARY

Embodiments of the invention are directed to a semiconductor device. A non-limiting example of the semiconductor device includes a metal-oxide-semiconductor field-effect-transistor (MOSFET) device electrically attachable to a first data line and a read-only memory (ROM) element. The ROM element is electrically interposable between the MOSFET device and a second data line. The ROM element includes first and second sets of memory cells in high and low resistance states, respectively, to form a secure identifier (ID).

Embodiments of the invention are directed to a semiconductor device. A non-limiting example of the semiconductor device includes a first data line, a second data line, a metal-oxide-semiconductor field-effect-transistor (MOSFET) device, which is electrically attached to the first data line, and a read-only memory (ROM) element. The ROM element is electrically interposed between the MOSFET device and the second data line. The ROM element includes first and second sets of memory cells in high and low resistance states, respectively, to form a secure identifier (ID).

Embodiments of the present invention are directed to a method of fabricating a die with a secure identifier (ID). A non-limiting example of the method includes executing metal-oxide-semiconductor field-effect-transistor (MOSFET) fabrication of a module of the die and inserting a read-only memory (ROM) element in the module during the MOSFET fabrication. The method further includes programming a unique ID in the ROM element.

Embodiments of the present invention are directed to a method of forming a front- or back-end-of-line (FEOL or BEOL) module of an integrated circuit (IC) of a die. A non-limiting example of the method of forming the FEOL or BEOL module of the IC of the die includes electrically attaching a metal-oxide-semiconductor field-effect-transistor (MOSFET) device to a word line and electrically interposing a read-only memory (ROM) element between the MOSFET device and a bit line. The ROM element includes memory cells in an initially high resistance state. The method also includes resetting the memory cells to a low resistance state, setting a first set of the memory cells in the low resistance state to a high resistance state and maintaining a second set of the memory cells in the low resistance state.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
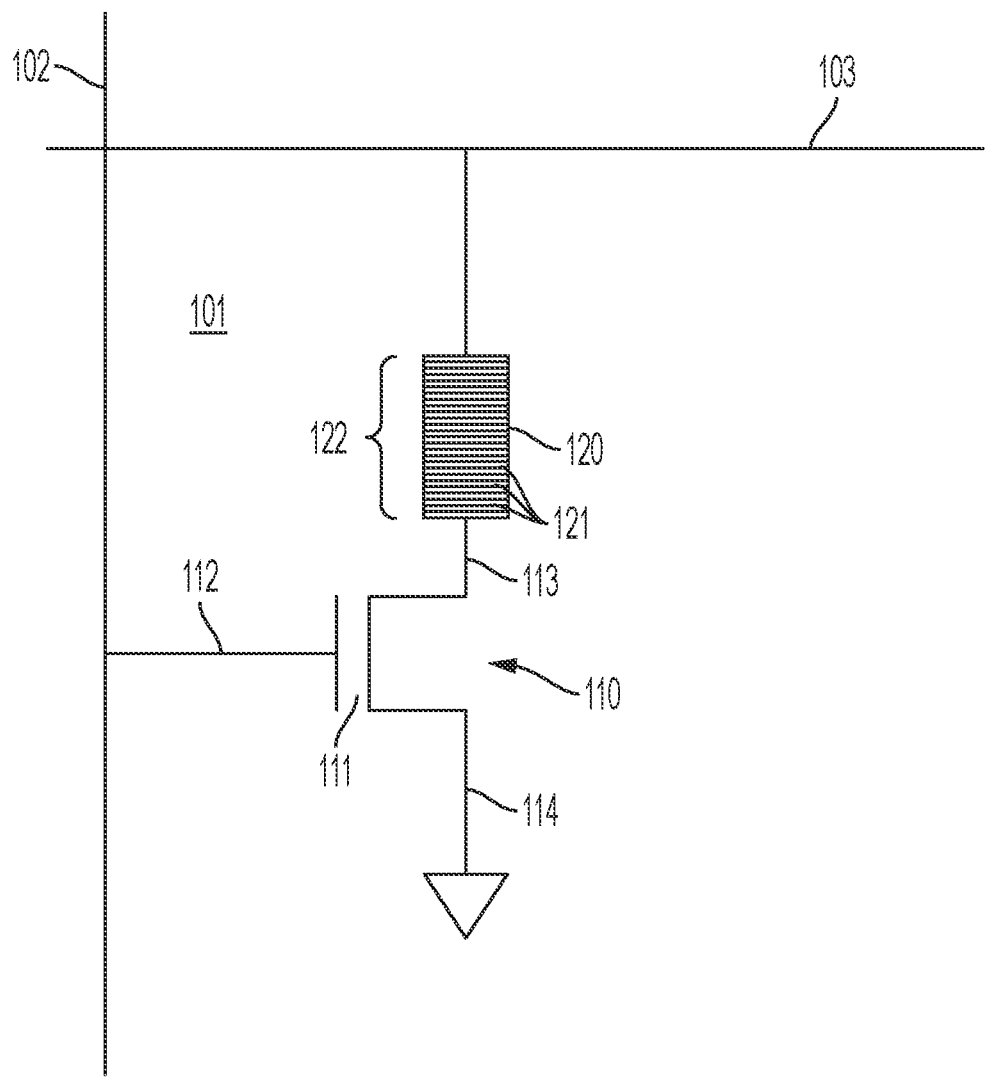
FIG. 1 is a schematic illustration of a semiconductor device in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, an integrated circuit (IC) is a set of electronic circuits on one small flat piece (or "chip") of semiconductor material, usually silicon. For example, large numbers of tiny metal-oxide-semiconductor field-effect transistors (MOSFETs) can be integrated into a small chip to form an IC. This results in circuits that are orders of magnitude smaller, faster and less expensive than those constructed of discrete electronic components. The IC's mass production capability, reliability and building-block approach to integrated circuit design has ensured the rapid adoption of standardized ICs in place of designs using discrete transistors. ICs are now used in virtually all electronic equipment and have revolutionized the world of electronics.

A problem exists, however, in that counterfeit ICs are often used in certain technologies and applications. In particular, counterfeit ICs are becoming an increasing problem where older chips are recycled from an old system and sold or resold as if they are new. Preventing such recycling is typically not feasible because prevention methods can be expensive in some cases and can be CMOS incompatible in these or other cases.

Turning now to an overview of the aspects of the invention, one or more embodiments of the invention address the above-described shortcomings of the prior art by providing for insertion of a read-only memory (ROM) element in front-end-of-line (FEOL) or back-end-of-line (BEOL) modules during standard metal-oxide-semiconductor field-effect-transistor (MOSFET) fabrication processes and generating a unique identifier (ID) in the ROM element for each authentic IC (i.e., good die). This ID cannot be effectively modified without destroying the host die.

The above-described aspects of the invention address the shortcomings of the prior art by providing for a low-cost and highly MOSFET compatible process for forming a ROM element for chip identification in an IC or die. This ROM element cannot be modified without destroying the host IC or die and will effectively prevent the host IC or die from being recycled as a counterfeit IC.

Turning now to a more detailed description of aspects of the present invention, FIG. 1 depicts a semiconductor device 101 according to one or more embodiments of the invention. The semiconductor device 101 includes a MOSFET device 110, such as a p-type metal-oxide-semiconductor field-effect-transistor (pMOSFET) or another similar type of semiconductor device, which is electrically attachable to a first data line, such as a word line, and a ROM element 120. The ROM element 120 is electrically interposable between a second data line, such as a bit line 103, and the MOSFET device 110. The MOSFET device 110 can include or be provided as a transistor 111 with a gate line 112, a source line 113 and a drain line 114. The gate line 112 can be electrically connected to the word line 102 and the ROM element 120 can be electrically interposed between the bit line 103 and the source line 113. The ROM element 120 includes first and second sets of memory cells 121 in high and low resistance states, respectively, to form a secure identifier (ID) 122. This secure ID 122 cannot be modified without irreparably harming the semiconductor device 101, for example by annealing at high temperatures for several hours.

The secure ID can track the presence of the semiconductor device 101 in a die or the presence of the die (including the semiconductor device 101) in a larger computing device. In any case, the secure ID 122 can prevent or substantially inhibit recycling (i.e., counterfeiting) of the semiconductor device 101.

Figure 2:
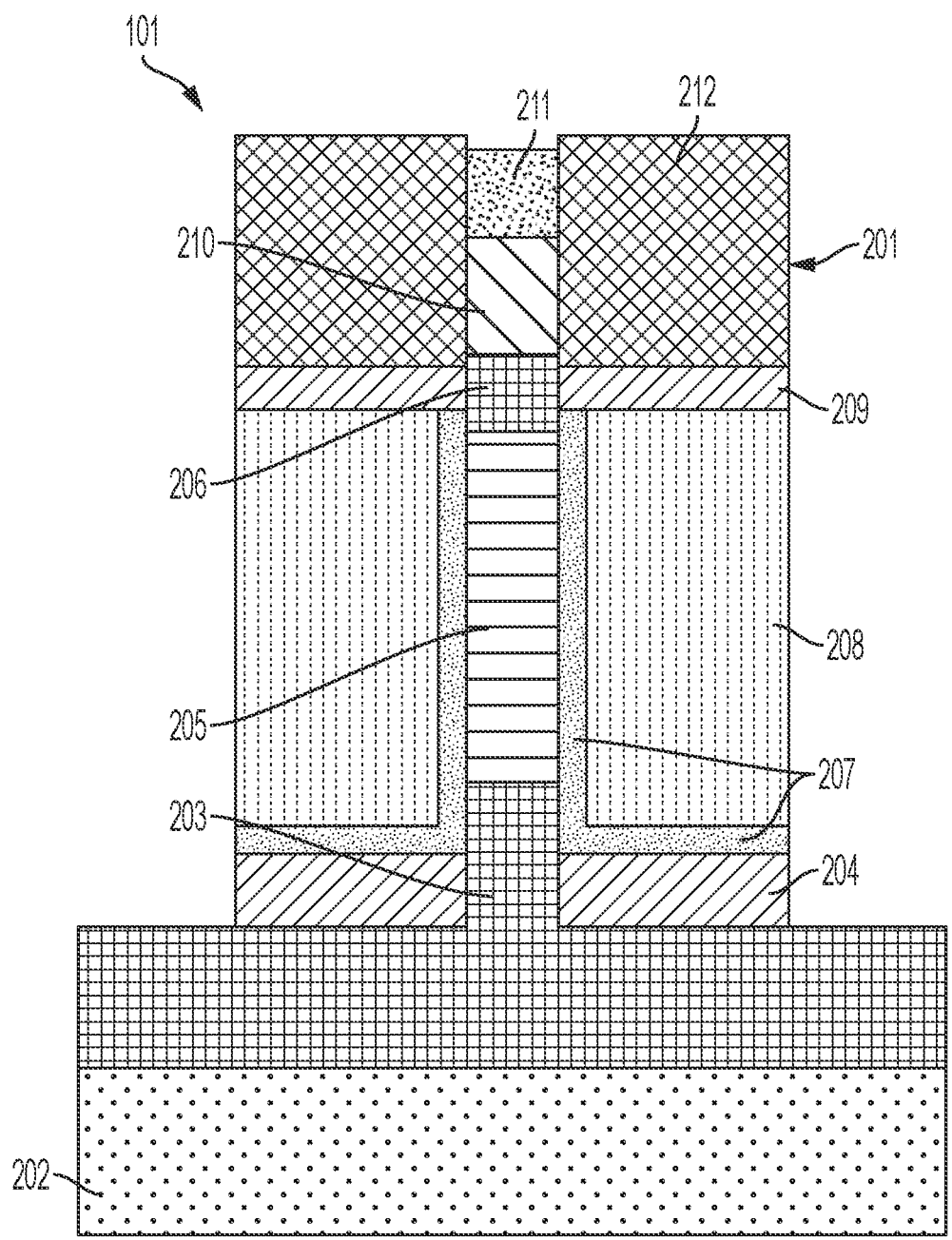
FIG. 2 is a schematic side view of a memory cell with a vertical transistor structure of the semiconductor device of FIG. 1 in accordance with one or more embodiments of the present invention.

With continued reference to FIG. 1 and with additional reference to FIG. 2, each memory cell 121 of the ROM element 120 of FIG. 1 includes a vertical transistor structure 201, such as a p-type vertical transistor. The vertical transistor structure 201 includes a semiconductor substrate 202 with source/drain (S/D) regions, a pillar 203 and bottom spacers 204 on either side of the pillar 203. The vertical transistor structure 201 further includes a fin 205 on the pillar 203, a doped silicon germanium (SiGe) layer 206 on the fin 205, a gate oxide 207 and a metal gate 208. The gate oxide 207 can be formed of high-k dielectric and lines exposed surfaces of the bottom spacers 204, an exposed section of the pillar 203, the fin 205 and a lower section of the doped SiGe layer 206. The vertical transistor structure 201 also includes top spacers 209, an intervening layer of undoped germanium with boron (hereinafter referred to as an "intervening GeB layer") 210, a metal contact 211 and dielectric material 212. The top spacers 209 are disposed over terminal ends of the gate oxide 207, the metal gate 208 and sides of the doped SiGe layer 206. The intervening GeB layer 210 is interposed between the doped SiGe layer 206 and the metal contact 211. The dielectric material 212 can be silicon dioxide and surrounds an upper section of the doped SiGe layer 206, the intervening GeB layer 210 and the metal contact 211. The metal contact 211 can be formed of a metallic material that is not soluble in molten germanium.

Where the memory cell 121 is provided as a memory cell of the first set and is provided in the high resistance state, the intervening GeB layer 210 of the vertical transistor structure 201 of FIG. 2 is characterized in that dopants and other metals (e.g., tin) have been precipitated out. By contrast, where the memory cell 121 is provided as a memory cell of the second set and is provided in the low resistance state, the intervening GeB layer 210 of the vertical transistor structure 201 of FIG. 2 is characterized in that dopants are homogenously distributed therein.

Figure 3:
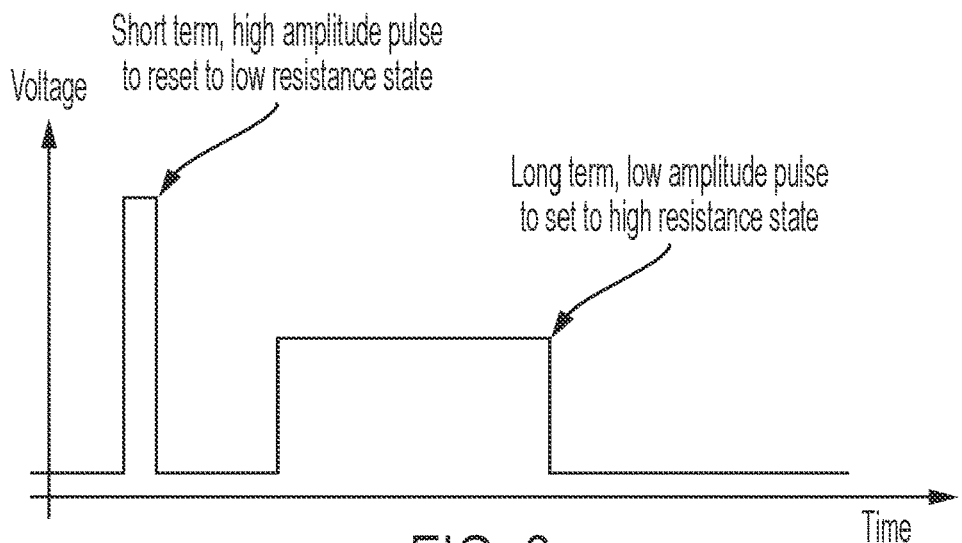
FIG. 3 is a graphical depiction of operations for resetting and setting memory cells in low and high resistance states, respectfully, in accordance with one or more embodiments of the present invention.

With continued reference to FIGS. 1 and 2 and with additional reference to FIG. 3, each of the memory cells 121 of the ROM element 120 is initially set in the high resistance state and are reset to the low resistance state. At this point, the first set of the memory cells 121 are set to the high resistance state and the second set of the memory cells 121 are maintained in the low resistance state.

The resetting of the memory cells 121 to the low resistance state is accomplished by applying current with a high pulse amplitude to cause each memory cell 121 to self-heat to a first temperature which is greater than a melting point of the semiconductor therein (i.e., the first temperature exceeds 700° C.). This current has a short pulse width of about 20-40 ns. It is long enough to allow for dopant diffusion in the molten phase and full crystallization. Due to fast diffusion in the molten phase and the sufficiently long pulse width, dopants will homogeneously distribute inside the germanium of the intervening GeB layer 210. Due to the short pulse width and the associated fast cooling, the homogeneous state will be preserved yielding a metastable alloy with high dopant activations. This provides for the lowest resistance state of the memory cells 121.

The setting of the memory cells 121 of the first set to the high resistance state is accomplished by applying a current with relatively low pulse amplitude. This causes the memory cells 121 of the first set to self-heat to a second temperature near to but below the melting point of the semiconductor therein (i.e., the second temperature is less than 700° C.).

This current has a long pulse width of about several milliseconds whereby the heating of the memory cells 121 of the first set will lead to dopant and metallic materials to precipitate out of the intervening GeB layer 210. Thus, strong dopant deactivation occurs and resistance of the memory cells 121 of the first set increases.

Figure 4:
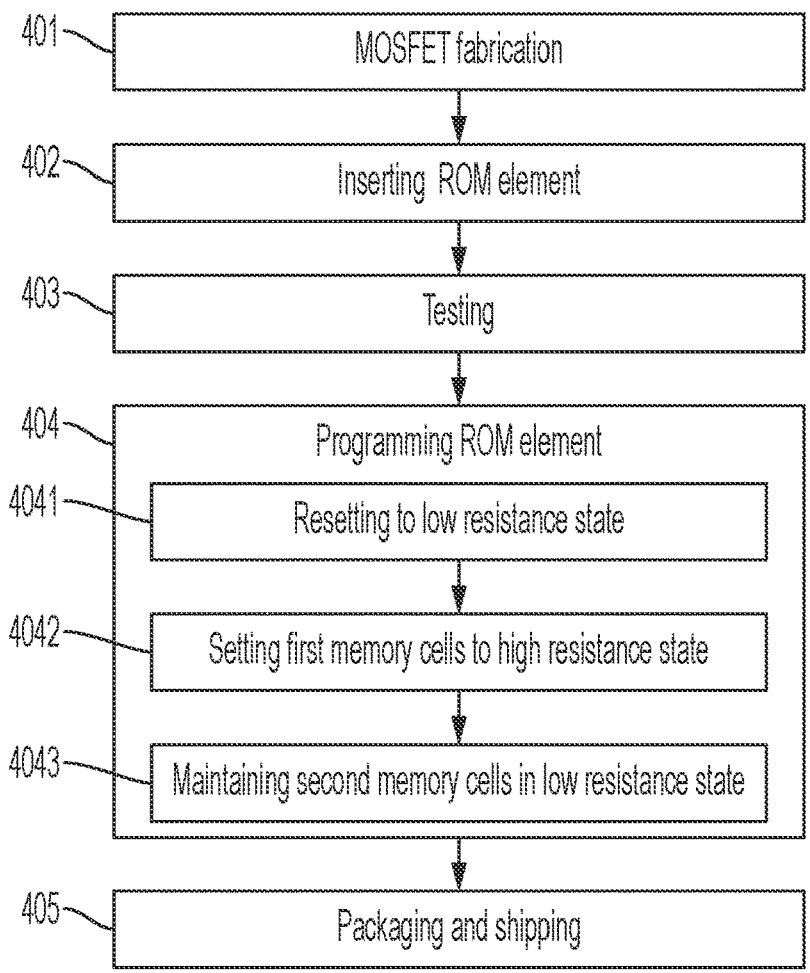
FIG. 4 depicts a flow diagram illustrating a method of fabricating a die with a secure identifier (ID) according to one or more embodiments of the invention.

With reference to FIG. 4, a method of fabricating a die with a secure ID is provided. The method includes executing MOSFET fabrication of a module of the die (401) and inserting a ROM element in the module during the MOSFET fabrication (402). The module of the die can include or be provided as one or more of a FEOL module and a BEOL module. The method further includes testing the die (403) following the executing of the MOSFET fabrication and the inserting of the ROM element of operations 401 and 402. The testing of operation 403 can include yield and functional testing. In addition, once the testing of operation 403 is complete, the method includes programming a unique ID in the ROM element (404) for only those dies that pass the testing and subsequently packaging and shipping the dies (405).

As explained above, the ROM element can include multiple memory cells and the programming of the unique ID of operation 404 can include resetting each of the memory cells to a low resistance state (4041), setting a first set of the memory cells in the low resistance state to a high resistance state (4042) and maintaining a second set of the memory cells in the low resistance state (4043) such that the first and second sets of the memory cells are respectively arranged as bits of the secure ID.

That is, in a case where there are eight memory cells in a given ROM element and the first three are set in the high resistance state signifying a "0", the next three are maintained in the low resistance state signifying a "1" and the last two alternate between the high and low resistance state signifying a "0" and "1" sequence, the ROM element as a whole can be read as having a "00011101" secure ID. This secure ID will remain with the semiconductor device and any die the semiconductor device is installed for substantially the lifetime of the semiconductor device and can be tracked for security and recycling/anti-counterfeiting efforts. Moreover, the secure ID cannot be removed from the semiconductor device without irreparably damaging the semiconductor device (i.e., by annealing the semiconductor device to about 600° C. for several hours).

In accordance with one or more embodiments of the present invention, the resetting of operation 4041 can include heating each of the memory cells to a first temperature above a melting point thereof. This can be accomplished by applying current with a high pulse amplitude and a short pulse width to heat a memory cell to the first temperature to promote therein homogenous dopant diffusion into germanium and subsequently terminating the current to allow the memory cell to cool from the first temperature quickly with homogenous dopant diffusion preserved. In accordance with one or more embodiments of the present invention, the setting of operation 4042 can include heating the first set of the memory cells to a second temperature below the melting point thereof. This can be accomplished by applying current with a low pulse amplitude and a long pulse width to heat a memory cell of the first set to the second temperature to promote therein dopant precipitation from germanium.

Figure 5:
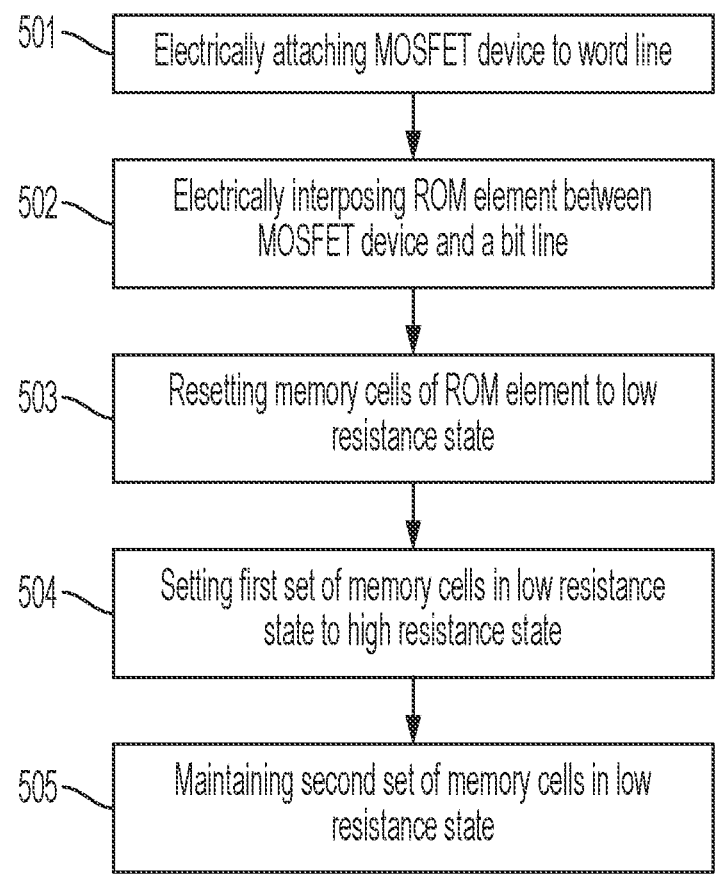
FIG. 5 depicts a flow diagram illustrating a method of forming a front- or back-end-of-line (FEOL or BEOL) module of an integrated circuit (IC) of a die according to one or more embodiments of the invention.

With reference to FIG. 5, a method of forming a FEOL or BEOL module of an IC of a die is provided. The method includes electrically attaching a MOSFET device to a word line (501) and electrically interposing a ROM element between the MOSFET device and a bit line (502). The MOSFET device can include or be provided as a transistor with a gate line that is electrically attached to the word line, a source line and a drain line. The ROM element is electrically interposed between the bit line and the source line. The ROM element includes memory cells in an initially high resistance state. The method further includes resetting the memory cells to a low resistance state (503), setting a first set of the memory cells in the low resistance state to a high resistance state (504) and maintaining a second set of the memory cells in the low resistance state (505). The first and second sets of the memory cells are thus arranged as bits of a secure ID.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a die with a secure identifier (ID), the method comprising:
    executing metal-oxide-semiconductor field-effect-transistor (MOSFET) fabrication of a module of the die;
    inserting a read-only memory (ROM) element comprising memory cells in the module during the MOSFET fabrication, each memory cell comprising a vertical transistor structure, wherein the vertical transistor structure comprising a pillar, a fin on the pillar, a doped silicon germanium (SiGe) layer on the fin, a metal contact and an intervening layer of germanium and boron (GeB) intervening between the doped SiGe layer and the metal contact; and
    programming, in the ROM element, a unique ID,
    wherein the programming is executed such that:
    the unique ID comprises a first set of the memory cells in a high resistance state, in which dopants and metals are precipitated out of the intervening layer, and a second set of the memory cells in a low resistance state, in which the dopants are homogenously distributed in the intervening layer, and
    the first set and the second sets of the memory cells are arranged as bits of the secure ID in the ROM element that cannot be removed without irreparably damaging the die.

2. The method according to claim 1, wherein the module of the die comprises one or more of a front-end-of-line (FEOL) module and a back-end-of-line (BEOL) module.

3. The method according to claim 1, further comprising: testing the die following the executing of the MOSFET fabrication and the inserting of the ROM element and prior to the programming of the unique ID, the programming is only executed for the die when the die passes the testing of the die.

4. The method according to claim 1, wherein the programming of the unique ID comprises:
    resetting each of the memory cells in the ROM element to the low resistance state;
    setting the first set of the memory cells in the low resistance state to the high resistance state; and
    maintaining the second set of the memory cells in the low resistance state.

5. The method according to claim 4, wherein:
    the resetting comprises heating each of the memory cells to a first temperature above a melting point of a semiconductor of the memory cells, and
    the setting comprises heating the first set of the memory cells to a second temperature below the melting point of the semiconductor of the memory cells.

6. The method according to claim 5, wherein the resetting further comprises:
    applying a first current with a high pulse amplitude and a short pulse width to heat each of the memory cells to the first temperature to promote therein homogenous dopant diffusion into germanium; and
    terminating the first current to allow each of the memory cells to cool from the first temperature quickly and to preserve the homogenous dopant diffusion.

7. The method according to claim 6, wherein the setting further comprises applying a second current with a low pulse amplitude and a long pulse width to heat each memory cell of the first set of the memory cells to the second temperature to promote therein dopant precipitation from germanium.

8. The method according to claim 1, wherein the executing of the MOSFET fabrication forms a MOSFET device and the method further comprises:
    electrically attaching the MOSFET device to a word line; and
    electrically interposing the ROM element comprising the memory cells between the MOSFET device and a bit line, each of the memory cells of the ROM element being in an initially high resistance state.

9. The method according to claim 8, wherein the method further comprises:
    resetting each of the memory cells in the ROM element to the low resistance state;
    setting the first set of the memory cells in the low resistance state to the high resistance state, which differs from the initially high resistance state; and
    maintaining the second set of the memory cells in the low resistance state.

10. The method according to claim 9, wherein:
    the resetting comprises heating each of the memory cells to a first temperature above a melting point of a semiconductor of the memory cells, and
    the setting comprises heating the second set of the memory cells to a second temperature below the melting point of the semiconductor of the memory cells.

11. The method according to claim 10, wherein the resetting further comprises: applying a first current with a high pulse amplitude and a short pulse width to heat each of the memory cells to the first temperature to promote therein homogenous dopant diffusion into germanium; and
    terminating the first current to allow each of the memory cells to cool from the first temperature quickly and to preserve the homogenous dopant diffusion.

12. The method according to claim 11, wherein the setting further comprises applying a second current with a low pulse amplitude and a long pulse width to heat each memory cell of the first set to the second temperature to promote therein dopant precipitation from germanium.

* * * * *